(12) United States Patent
Fulford et al.

(10) Patent No.: US 12,455,511 B2
(45) Date of Patent: *Oct. 28, 2025

(54) IN-SITU LITHOGRAPHY PATTERN ENHANCEMENT WITH LOCALIZED STRESS TREATMENT TUNING USING HEAT ZONES

(71) Applicant: Tokyo Electron Limited, Tokyo (JP)

(72) Inventors: Daniel J. Fulford, Cohoes, NY (US); Anthony R. Schepis, Averill Park, NY (US); Mark I. Gardner, Cedar Creek, TX (US); H. Jim Fulford, Marianna, FL (US); Anton J. DeVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 640 days.

This patent is subject to a terminal disclaimer.

(21) Appl. No.: 17/889,460

(22) Filed: Aug. 17, 2022

(65) Prior Publication Data

US 2023/0251584 A1 Aug. 10, 2023

Related U.S. Application Data

(60) Provisional application No. 63/306,588, filed on Feb. 4, 2022.

(51) Int. Cl.
*G03F 7/00* (2006.01)
*H01L 21/324* (2006.01)
(Continued)

(52) U.S. Cl.
CPC ...... *G03F 7/70783* (2013.01); *G03F 7/70483* (2013.01); *H01L 21/3247* (2013.01);
(Continued)

(58) Field of Classification Search
CPC ............ G03F 7/70483; G03F 7/70783; H01L 21/3247; H01L 21/67103; H01L 21/67115;
(Continued)

(56) References Cited

U.S. PATENT DOCUMENTS 9,842,879 B2 12/2017 Matsugai
10,355,042 B2 7/2019 Matsugai
(Continued)

FOREIGN PATENT DOCUMENTS

JP  2021-72361 A    5/2021
WO  WO-2006104582 A2 * 10/2006 ........... C23C 16/345
WO  WO 2021/154641 A1   8/2021

OTHER PUBLICATIONS

International Search Report and Written Opinion issued Apr. 20, 2023 in PCT/US2022/052083, 9 pages.

*Primary Examiner* — Peter B Kim
(74) *Attorney, Agent, or Firm* — Oblon, McClelland, Maier &Neustadt, L.L.P.

(57) ABSTRACT

Aspects of the present disclosure provide a method for optimizing wafer shape. For example, the method can include receiving a wafer having a working surface for one or more devices to be fabricated thereon and a backside surface opposite to the working surface, measuring the wafer to identify bow measurement of the wafer, and forming a stress-modification film on the backside surface of the wafer. The stress-modification film can be reactive to heat such that applied heat modifies an internal stress of the stress-modification film. The method can also include applying a pattern of heat onto the stress-modification film to modify the internal stress of the stress-modification film, the pattern of heat corresponding to the bow measurement.

11 Claims, 13 Drawing Sheets

(51) Int. Cl.
 *H01L 21/66* (2006.01)
 *H01L 21/67* (2006.01)
(52) U.S. Cl.
 CPC .. *H01L 21/67103* (2013.01); *H01L 21/67115* (2013.01); *H01L 21/67288* (2013.01); *H01L 22/20* (2013.01)
(58) Field of Classification Search
 CPC ......... H01L 21/67248; H01L 21/67288; H01L 21/302; H01L 22/12; H01L 22/20
 See application file for complete search history.

(56) References Cited

U.S. PATENT DOCUMENTS

| | | | |
|---|---|---|---|
| 10,763,431 | B2 | 9/2020 | Ok et al. |
| 10,854,667 | B2 | 12/2020 | Matsugai |
| 2021/0366792 | A1 | 11/2021 | Fulford et al. |
| 2022/0336226 | A1* | 10/2022 | Cutler ..................... G03F 7/203 |
| 2023/0251574 | A1* | 8/2023 | Schepis ................... G03F 7/092 |
| 2024/0203797 | A1* | 6/2024 | Weloth .................... H01L 22/20 |

* cited by examiner

IN-SITU LITHOGRAPHY PATTERN ENHANCEMENT WITH LOCALIZED STRESS TREATMENT TUNING USING HEAT ZONES

INCORPORATION BY REFERENCE

This present disclosure claims the benefit of U.S. Provisional Application No. 63/306,588, "IN-SITU LITHOGRAPHY PATTERN ENHANCEMENT WITH LOCALIZED STRESS TREATMENT TUNING USING HEAT ZONES" filed on Feb. 4, 2022, which is incorporated herein by reference in its entirety.

FIELD OF THE INVENTION

The present disclosure relates to semiconductor fabrication, and, more particularly, to wafer curvature, bow and overall wafer shape.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor fabrication involves multiple varied steps and processes. One typical fabrication process is known as photolithography (also called microlithography). Photolithography uses radiation, such as ultraviolet or visible light, to generate fine patterns in a semiconductor device design. Many types of semiconductor devices, such as diodes, transistors, and integrated circuits, can be constructed using semiconductor fabrication techniques including photolithography, etching, film deposition, surface cleaning, metallization, and so forth.

Exposure systems (also called tools) are used to implement photolithographic techniques. An exposure system typically includes an illumination system, a reticle (also called a photomask) or spatial light modulator (SLM) for creating a circuit pattern, a projection system, and a wafer alignment stage for aligning a photosensitive resist-covered semiconductor wafer. The illumination system illuminates a region of the reticle or SLM with a (preferably) rectangular slot illumination field. The projection system projects an image of the illuminated region of the reticle pattern onto the wafer. For accurate projection, it is important to expose a pattern of light on a wafer that is relatively flat or planar, preferably having less than 10 microns of height deviation.

SUMMARY

Aspects of the present disclosure provide a method for enhancing a lithography pattern with localized stress treatment tuning using heat zones. For example, the method can include receiving a wafer having a working surface for one or more devices to be fabricated thereon and a backside surface opposite to the working surface, measuring the wafer to identify bow measurement of the wafer, and forming a stress-modification film on the backside surface of the wafer. The stress-modification film can be reactive to heat such that applied heat modifies an internal stress of the stress-modification film. The method can further include applying a pattern of heat onto the stress-modification film to modify the internal stress of the stress-modification film, the pattern of heat corresponding to the bow measurement. In an embodiment, forming a stress-modification film can be performed prior to measuring the wafer to identify bow measurement of the wafer. In another embodiment, forming a stress-modification film can be performed subsequent to measuring the wafer to identify bow measurement of the wafer.

In an embodiment, the pattern of heat can be applied by a laser. In another embodiment, the bow measurement can include a plurality of sub-bow measurements, and the pattern of heat is applied by a plurality of heating units that correspond to the sub-bow measurements. For example, the heating units can be installed on a wafer chuck.

In an embodiment, the working surface of the wafer can be with one or more devices fabricated thereon, and the method can further include forming a protection film on the working surface of the wafer to protect the devices. For example, measuring the wafer to identify bow measurement of the wafer can be performed subsequent to forming a protection layer. As another example, measuring the wafer to identify bow measurement of the wafer can be performed prior to forming a protection layer.

Aspects of the present disclosure provide another method for enhancing a lithography pattern with localized stress treatment tuning using heat zones. For example, the method can include receiving a wafer having a working surface for one or more devices to be fabricated thereon and a backside surface opposite to the working surface, measuring the wafer to identify bow measurement of the wafer, forming a first stress-modification film on a first surface of the working surface and the backside surface of the wafer, and forming a second stress-modification film on a second surface of the working surface and the backside surface of the wafer. The first stress-modification film can be reactive to heat such that applied heat modifies an internal stress of the first stress-modification film. The second stress-modification film can be reactive to heat such that applied heat modifies an internal stress of the second stress-modification film. The method can further include applying a first pattern of heat onto the first stress-modification film to modify the internal stress of the first stress-modification film, and applying a second pattern of heat onto the second stress-modification film to modify the internal stress of the second stress-modification film. The first and second patterns of heat can correspond to the bow measurement of the wafer.

In an embodiment, forming a first stress-modification film can be performed prior to measuring the wafer to identify bow measurement of the wafer. In another embodiment, forming a second stress-modification film can be performed prior to measuring the wafer to identify bow measurement of the wafer. In some embodiments, forming a first stress-modification film can be performed subsequent to measuring the wafer to identify bow measurement of the wafer.

Aspects of the present disclosure also provide a system for enhancing a lithography pattern with localized stress treatment tuning using heat zones. For example, the system can a bow measurement device, a stress-modification film formation device, a heat generator, and a controller coupled to the bow measurement device, the stress-modification film formation device and the heat generator. The bow measurement device can be configured to measure a wafer to identify bow measurement of the wafer. The wafer can have a working surface for one or more devices to be fabricated thereon and a backside surface opposite to the working surface. The stress-modification film formation device can be configured to form first and second stress-modification films. The first and second stress-modification films can be reactive to heat such that applied heat modifies internal stresses of the first and second stress-modification films. The heat generator can be configured to generate a pattern of heat. The controller can be configured to control the bow measurement device to measure the wafer to identify the bow measurement of the wafer, control the stress-modification film formation device to form the first and second stress-modification films on the backside surface and working surface of the wafer, respectively, and control the heat generator to generate and apply the pattern of heat onto the first stress-modification film and/or the first and second stress-modification films, the pattern of heat corresponding to the bow measurement.

In an embodiment, the heat generator can include a laser. In another embodiment, the bow measurement can include a plurality of sub-bow measurements, and the heat generator includes a plurality of heating units that correspond to the sub-bow measurements. For example, the system can further include a wafer chuck, and the heating units are installed on the wafer chuck.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

To achieve the best resolution using a mask with a laser or EMS λ (electromagnetic spectrum wavelength) sensitive stress deposited films to define areas that are either blocked or opened for a subsequent stress transfer or implant requires the wafer surface to be of optimum shape prior to the photo/lithographic process. The present disclosure can use all types of light sensitive wavelengths/lithography types in the electro-magnetic spectrum (some examples are photo lithography, e-beam lithography, direct laser write, and x-ray lithography).

Techniques disclosed herein define several invention flows to achieve the optimum wafer shape (using localized stress treatment of the semiconductor wafer lattice) prior to the photo process that is used on the working surface of the wafer. Process flows herein include a disposable lattice-tuning film on either the backside or working surface of the wafer as one option. Another option is to leave the lattice tuning film in place for subsequent processing steps.

By using a wafer backside or working surface stress-modification film that may be heated in different zones (either by a wafer chuck or laser as some examples) to modify the initial stress from the deposited condition. This will be possible because accessible wafer chucks can be modified to have greater than 50 micro temperature locations (heat zones) on the backside surface of the wafer. One unique aspect is that the deposited backside surface stress-modification film can be either compressive stress, neutral stress, or tensile stress in the deposited condition, then will be modified in the various micro temperature regions with different temperature ranges to produce localized stress (compressive, tensile, neutral) to reduce wafer bow to enhance lithography precision (because optimum wafer shape is achieved).

Also included herein is a method to use a direct write laser system to provide the localized heating as an option for EM heating, with any wavelength selection available. Also the flow process may go through iterations at the same step or subsequent process steps to maintain optimum wafer shape at all process locations that require lithography. A feature herein is that no mask is required with this in-situ pattern enhancement technique.

Figure 1C:
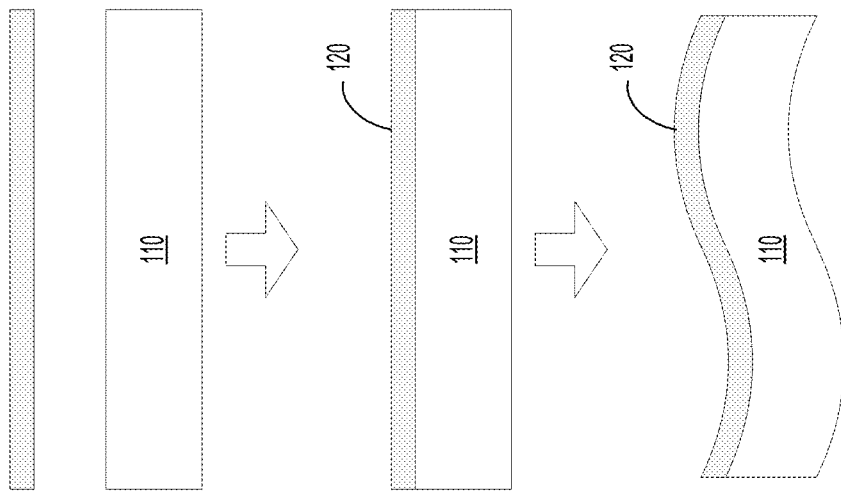
FIGS. 1A to 1C show first and second order bowing of a wafer.
Figure 1B:
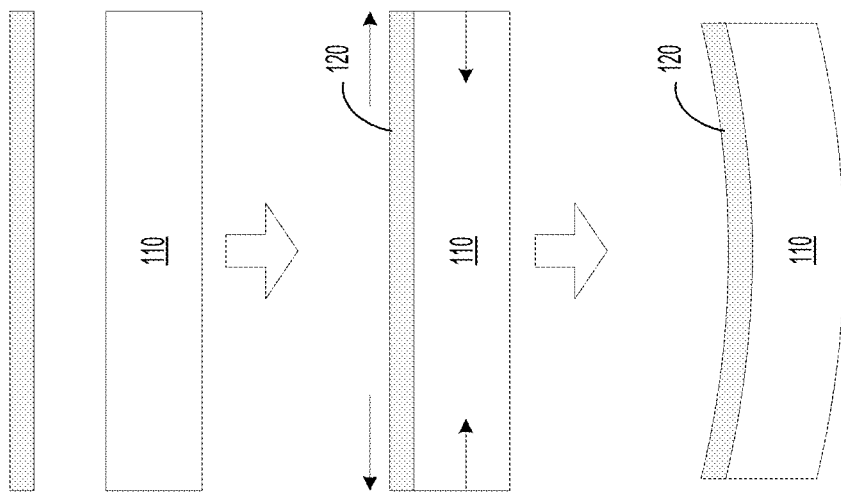
Figure 1A:
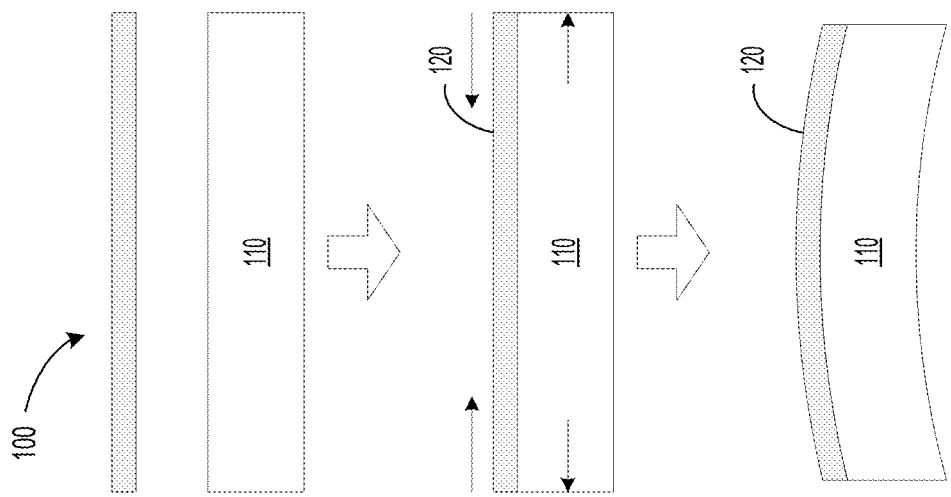

Microfabrication of a semiconductor structure 100 begins with a flat substrate or wafer 110, as those illustrated in FIGS. 1A to 1C. During microfabrication of the semiconductor structure 100, multiple processing steps are executed that can include depositing material on the substrate 110, removing material, implanting dopants, annealing, baking, and so forth. Different materials and structural formations 120 thus formed can cause internal stresses in the substrate 110 which result in bowing of the semiconductor structure 100, which in turn affects overlay and typically results in overlay errors of various magnitudes. For example, FIGS. 1A and 1B show how the different materials and structural formations 120 can either induce a compressive or tensile stress in the substrate 110, respectively, resulting in first order bowing with bow measurements illustrating z-direction height deviations from a reference plane (not shown). As another example, FIG. 1C shows second order bowing of the substrate 110 with two bow measurements identifying positive and negative z-direction height deviations, respectively.

If a region of the substrate 110 initially contains compressive stress or tensile stress, the opposite type of stress may be applied in a localized nano stress region. By using an array of heat zones or locations on a wafer chuck to modify an internal stress of a stress-modification film, an optimum wafer shape can be achieved quickly and with minimal cost.

Figure 2:
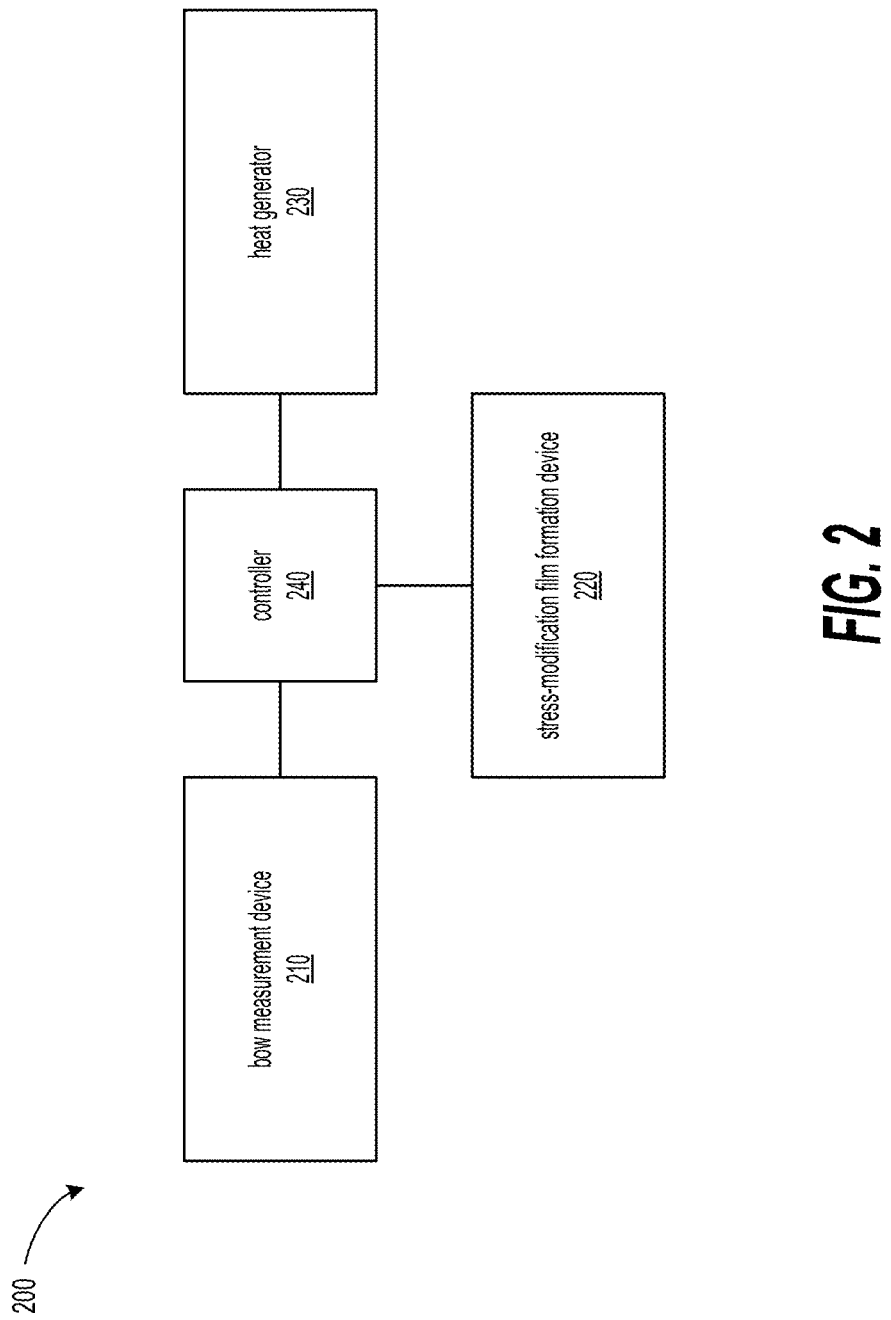
FIG. 2 is a functional block diagram of an exemplary system for achieving an optimum wafer shape, in accordance to some embodiments of the present disclosure.

FIG. 2 is a functional block diagram of an exemplary system 200 for achieving an optimum wafer shape, in accordance to some embodiments of the present disclosure. For example, the system 200 can include metrology equipment, e.g., a bow measurement device 210, which is configured to measure a substrate or a wafer (e.g., the substrate 110 shown in FIG. 1) to identify bow measurement of the wafer. In an embodiment, the bow measurement device 210 can use optical (e.g., using a scanning laser technique), acoustic and other mechanisms to measure the z-direction height deviations across a surface of the wafer and store the height deviations by (x, y) coordinates in order to identify a plurality of sub-bow measurements (x, y) of the bow measurement. The z-direction height deviations can be mapped at various resolutions depending on type of metrology equipment used and/or a resolution desired. The bow measurement (and the sub-bow measurements as well) can include raw bow data, or be represented as a bow signature with relative values. In an embodiment, the wafer has a working surface and a backside surface opposite to the working surface. The wafer may have an amount of wafer bow as a result from one or more micro fabrication processing steps that have been executed to create at least part of a semiconductor structure on the working surface of the wafer. For example, transistor gates may be completed or only partially completed.

The system 200 further includes a deposition module or a spin-coating module, e.g., a stress-modification film formation device 220, which is configured to deposit and form a stress-modification film on the backside surface and/or the working surface of the wafer. The stress-modification film, when reactive to heat, may have its internal stress modified by the heat. The stress-modification film formation device 220 can be configured to form two or more stress-modification films of different, e.g., opposing, stresses.

Figure 3:
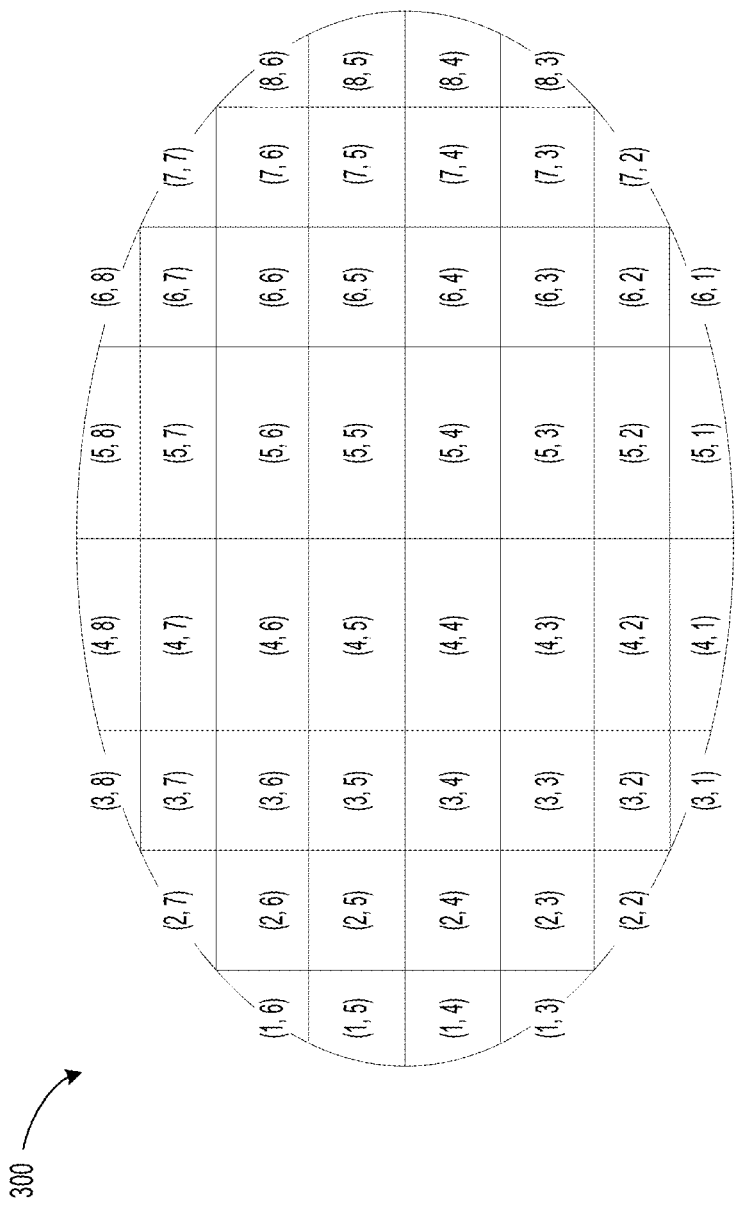
FIG. 3 shows an exemplary pattern of heat generated by a heat generator of the exemplary system shown in FIG. 2.

The system 200 further includes a heat generator 230, which is configured to generate a pattern of heat 300, as shown in FIG. 3. In an embodiment, the heat generator 230 includes a laser, e.g., a direct laser write. In another embodiment, the heat generator 230 can include a plurality of heating units, which can be installed on a wafer chuck and have an arrangement corresponding to the pattern of heat 300. For example, the heat generator 230 can include heating units (3, 1) to (6, 1), (2, 2) to (7, 2), (1, 3) to (8, 3), (1, 4) to (8, 4), (1, 5) to (8, 5), (1, 6) to (8, 6), (2, 7) to (7, 7) and (3, 8) to (6, 8), a total of 52 heating units, and the bow measurement device 210 can measure a wafer to identify bow measurement of the wafer, which include corresponding sub-bow measurements (3, 1) to (6, 1), (2, 2) to (7, 2), (1, 3) to (8, 3), (1, 4) to (8, 4), (1, 5) to (8, 5), (1, 6) to (8, 6), (2, 7) to (7, 7) and (3, 8) to (6, 8). The (Poseidon) micro pattern of heat 300 herein can eliminate the warp such that high resolution lithographic patterning can be maintained throughout all process steps for 3D stacking.

The heat generator 230 can generate a plurality of temperature ranges of heat. For example, the heat generator 230 can generate a first temperature range up to 200° C. of heat, a second temperature range between 200° C. and 500° C. of heat, a third temperature range between 500° C. and 800° C. of heat, and a fourth temperature range over 800° C. of heat.

Returning to FIG. 2, the system 200 further includes a controller 240, which is coupled to the bow measurement device 210, the stress-modification film formation device 220 and the heat generator 230. The controller 240 is configured to control the bow measurement device 210 to measure the wafer to identify the bow measurement (and the sub-bow measurements) of the wafer, control the stress-modification film formation device 220 to form the stress-modification film(s) on the backside surface and/or the working surface of the wafer, and control the heat generator 230 to generate and apply the pattern of heat 300 onto the stress-modification film(s), the pattern of heat corresponding to the bow measurement (and the sub-bow measurements).

Alternatively, or in addition, the controller 240 can be coupled to one or more additional controllers/computers (not shown), and the controller 240 can obtain setup and/or configuration information from an additional controller/computer. The controller 240 can be used to configure any or all of the elements of the system 200, and the controller 240 can collect, provide, process, store, and display data from any or all of the tool components. The controller 240 can comprise a number of applications for controlling any or all of the tool components. For example, the controller 240 can include a graphic user interface (GUI) component that can provide easy to use interfaces that enable a user to monitor and/or control one or more tool components.

The controller 240 can include a microprocessor, memory, and a digital I/O port capable of generating control voltages sufficient to communicate, activate inputs, and exchange information with the semiconductor processing system 200 as well as monitor outputs from the semiconductor processing system 200. For example, a program stored in the memory may be utilized to activate the inputs of the bow measurement device 210 and/or stress-modification film formation device 220 according to a process recipe in order to perform integrated substrate processing. The controller 2400 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 240 may be locally located relative to the system 200, or it may be remotely located relative to the system 200. For example, the controller 240 may exchange data with the system 200 using at least one of a direct connection, an intranet, the Internet and a wireless connection. The controller 240 may be coupled to an intranet at, for example, a customer site (i.e., a device maker, etc.), or it may be coupled to an intranet at, for example, a vendor site (i.e., an equipment manufacturer). Additionally, for example, the controller 240 may be coupled to the Internet. Furthermore, another computer (i.e., controller, server, etc.) may access, for example, the controller 240 to exchange data via at least one of a direct connection, an intranet, and the Internet. As also would be appreciated by those skilled in the art, the controller 240 may exchange data with the system 200 via a wireless connection.

The system 200 can further include other components, such as a wafer chuck for a wafer to be placed thereon, a robot handler configured to flip the wafer, a wafer damper configured to clamp a wafer, a bake device configured to bake the photoresist, an imaging device configured to expose the photoresist to an actinic radiation patter, a development device configured to develop a latent image in the photoresist, and an etching device configured to use plasma or vapor-phase etching or wet etching.

There are several process flows enabled herein, e.g., Process Flows A to D. Each of Process Flows A to D can use a scanning laser technique, for example, to determine detailed (x, y) stress map prior to the backside surface and/or working surface stress-modification film treatment. Note that combinations of all flows and sequences may be repeated at future process steps to achieve optimum wafer shape for all lithography process steps until the wafer has an average z-direction height deviation of less than 10 microns, for example, and is close to being flat or considered flat for overlay improvement herein. Process Flow A—Deposit on a backside surface of a wafer a stress-modification film that has an internal stress changed when heat is applied onto the stress-modification film. Multiple micro heat zones are provided to form a heat wafer gradient on the stress-modification film to make multiple stress regions to provide the optimum wafer shape. Process Flow B—Deposit a stress-modification film on a backside surface of a wafer, and then use multiple laser beam pulses to form a heat wafer gradient on the stress-modification film to make multiple stress regions such that optimum wafer shape can be achieved. Process Flow C—Deposit a first stress-modification film on a backside surface of a wafer and also a second stress-modification film on a working surface of the wafer, and then use multiple laser beam pulses to form a heat wafer gradient on the first and second stress-modification films to make multiple stress regions such that optimum wafer shape can be achieved. Process Flow D—Deposit a first stress-modification film on a backside surface of a wafer and also a second stress-modification film on a working surface of the wafer, and then use laser energy to form a heat wafer gradient on the first and second stress-modification films to make multiple stress regions such that optimum wafer shape can be achieved.

Figure 4:
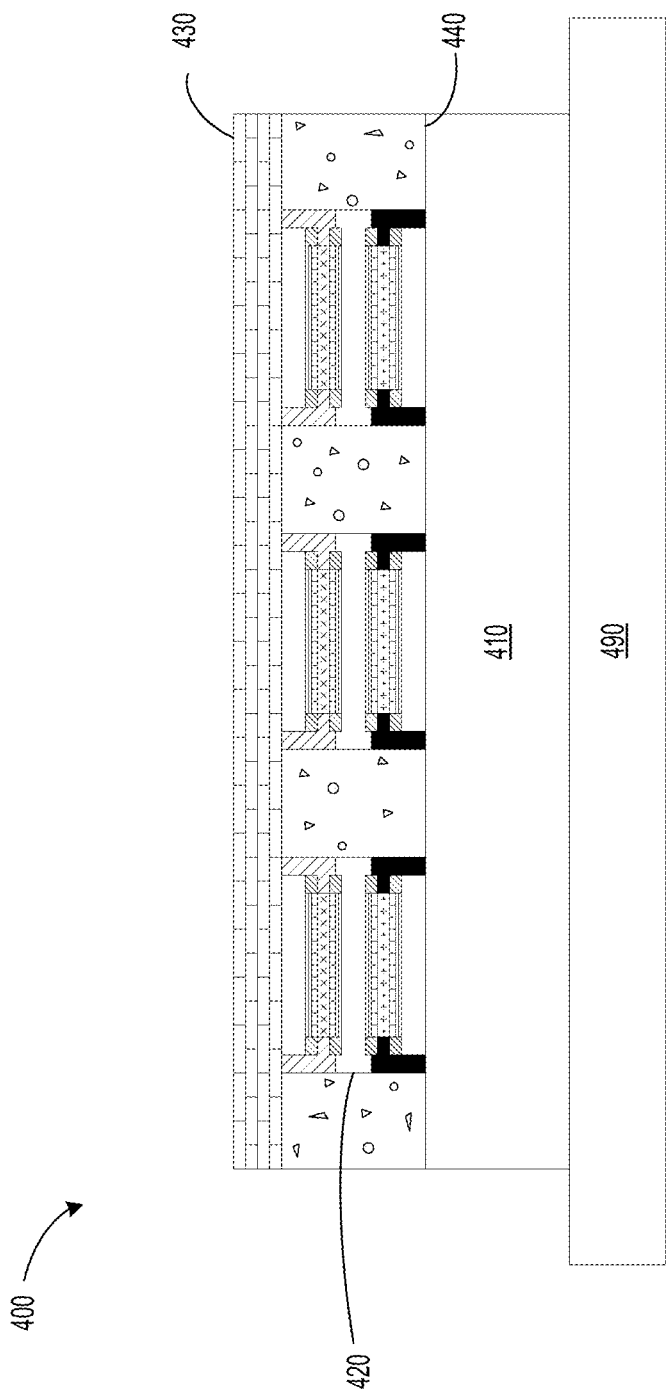
FIGS. 4 to 7 show a first exemplary process flow used to optimize wafer shape of a semiconductor structure, in accordance with some embodiments of the present disclosure.

FIGS. 4-7 show Process Flow A, which is used to optimize wafer shape of a semiconductor structure 400, in accordance with some embodiments of the present disclosure. As shown in FIG. 4, the semiconductor structure 400 is placed on a wafer chuck 490. The semiconductor structure 400 may include a substrate 410 and one or more semiconductor devices 420 fabricated on a working surface 440 of the substrate 410 through stack of 3D gate-all-around (GAA) nano sheets. The semiconductor devices 420 can include logic gates, memories and/or other components. For example, the semiconductor devices 420 can include complementary field-effect transistors (CFETs). A protection layer 430 can be formed on the working surface 440 of a wafer (including the substrate 410 and the semiconductor devices 420) to protect the semiconductor devices 420.

Figure 5:
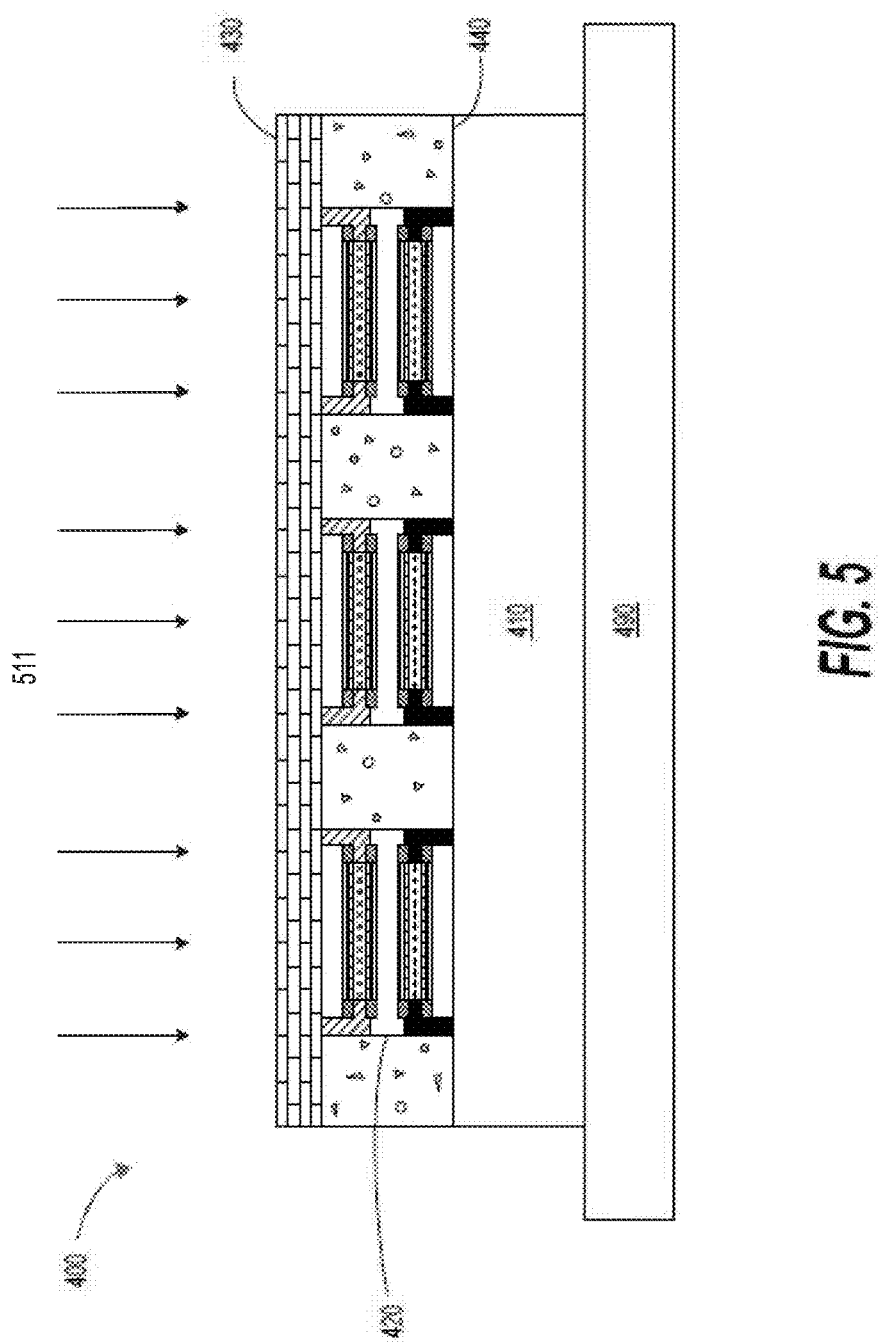

As shown in FIG. 5, a scanning laser technique 511 can be used, e.g., by the bow measurement device 210, to measure the z-direction height deviations across the surface of the wafer and store the height deviations by (x, y) coordinates in order to identify the sub-bow measurements of the bow measurement of the wafer. In an embodiment, the sub-bow measurements have an arrangement corresponding to the heating units (and the pattern of heat 300) of the heat generator 230.

Figure 6:
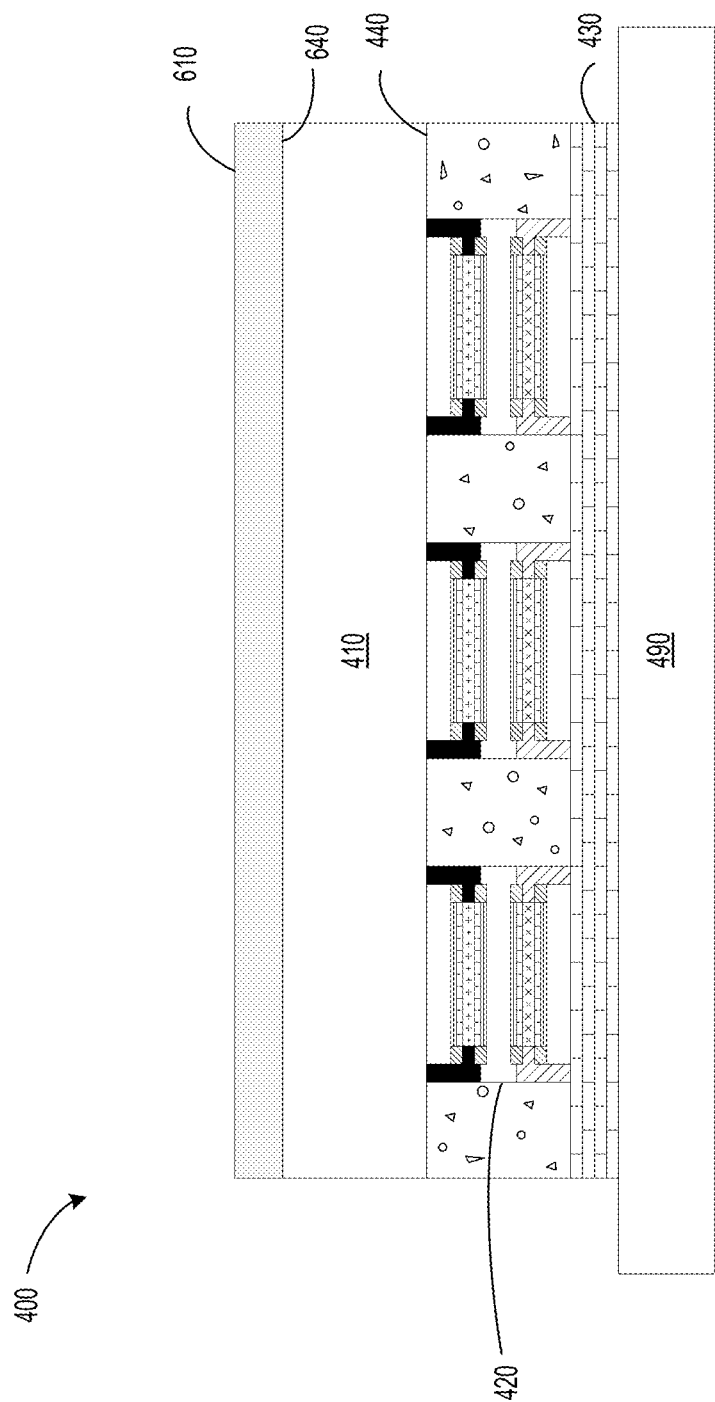

As shown in FIG. 6, the wafer is flipped upside down, and then a stress-modification film 610 can be formed, e.g., by the stress-modification film formation device 220, and applied onto a backside surface 640 of the wafer. The stress-modification film 610, such as a carbon nanotube boron nitride film, can be reactive to heat such that applied heat modifies an internal stress of the stress-modification film 610. For example, the stress-modification film 610 can have a neutral internal stress, and be reactive to the pattern of heat 300 generated by the heating units of the heat generator 230 and modified to become compressive or tensile at various locations corresponding to the pattern of heat 300. In some embodiments, the stress-modification film 610 may be initially compressive or tensile, and the scanning laser technique 511 is used to measure the z-direction height deviations across the surface of the wafer (including the stress-modification film 610) and store the height deviations by (x, y) coordinates in order to identify the sub-bow measurements of the bow measurement of the wafer (including the stress-modification film 610).

Figure 7:
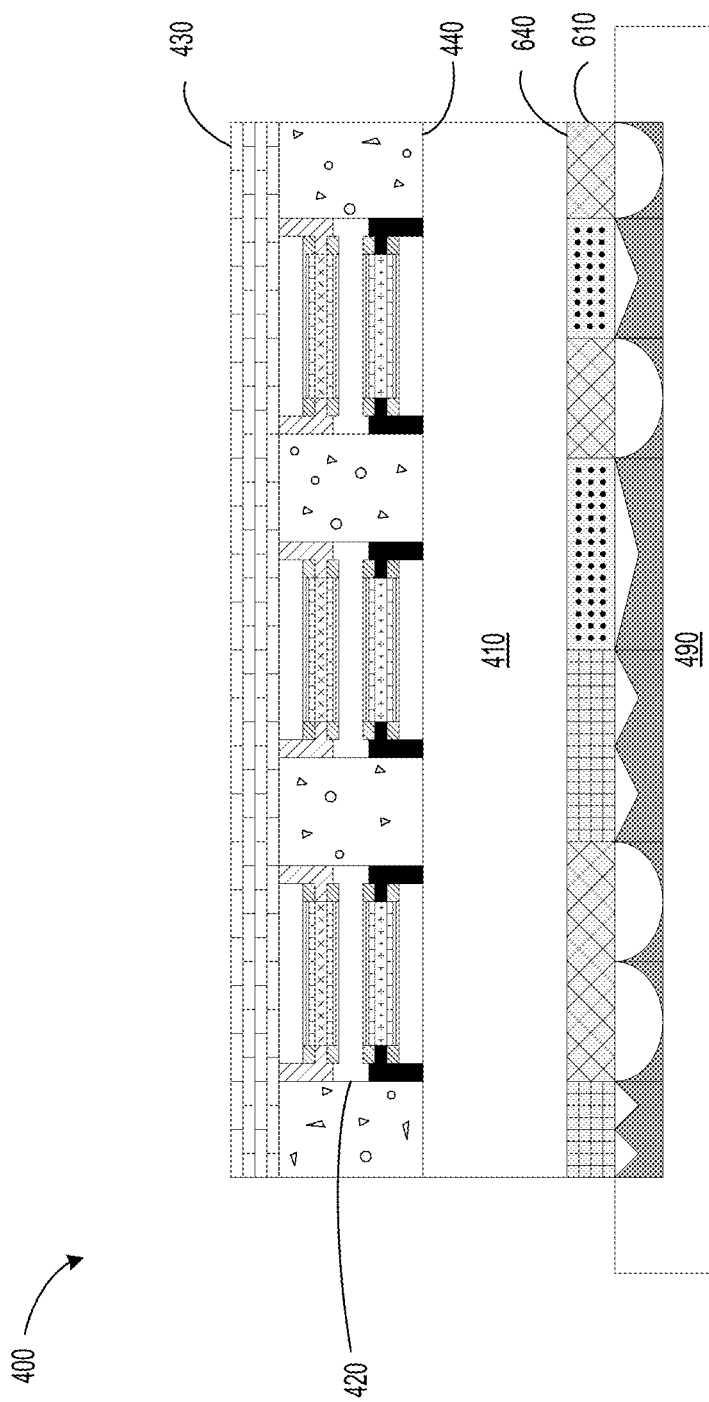

As shown in FIG. 7, the wafer is flipped and placed on the wafer chuck 490 with multiple heat zones, which correspond to the heating units of the heat generator 230. The pattern of heat 300 is then generated, e.g., by the heat generator 230, based on the sub-bow measurements of the bow measurement of the wafer, and applied onto the stress-modification film 610 such that the applied pattern of heat 300 modifies the internal stress of the stress-modification film 610, which corresponds to the sub-bow measurements. For example, the pattern of heat 300 can include three temperature ranges of heat to produce three different stress values in one in-situ process step. In an embodiment, the wafer chuck 490 has two heat zones-center and edge-which can be used for first order bowing modification. In another embodiment, the wafer chuck 490 can have two or more heat zones, which are used for second or higher order bowing modification. The heat generator 230 may include different types of heating units. For example, the heating units located within a peripheral region can have one resistive heater type, while the heating units located within an inner region can have a different heater type. The protection layer 430 can be removed, and the semiconductor structure 400 can be completed through a photolithography module, e.g., a coating device, an imaging device, a development device etc. Stress memorization can also be used herein. In some embodiments, the stress-modification film 610 can also be removed, and the semiconductor lattice has a memory effect because the stress of the stress-modification film 610 has been transferred to the silicon lattice.

Figure 8:
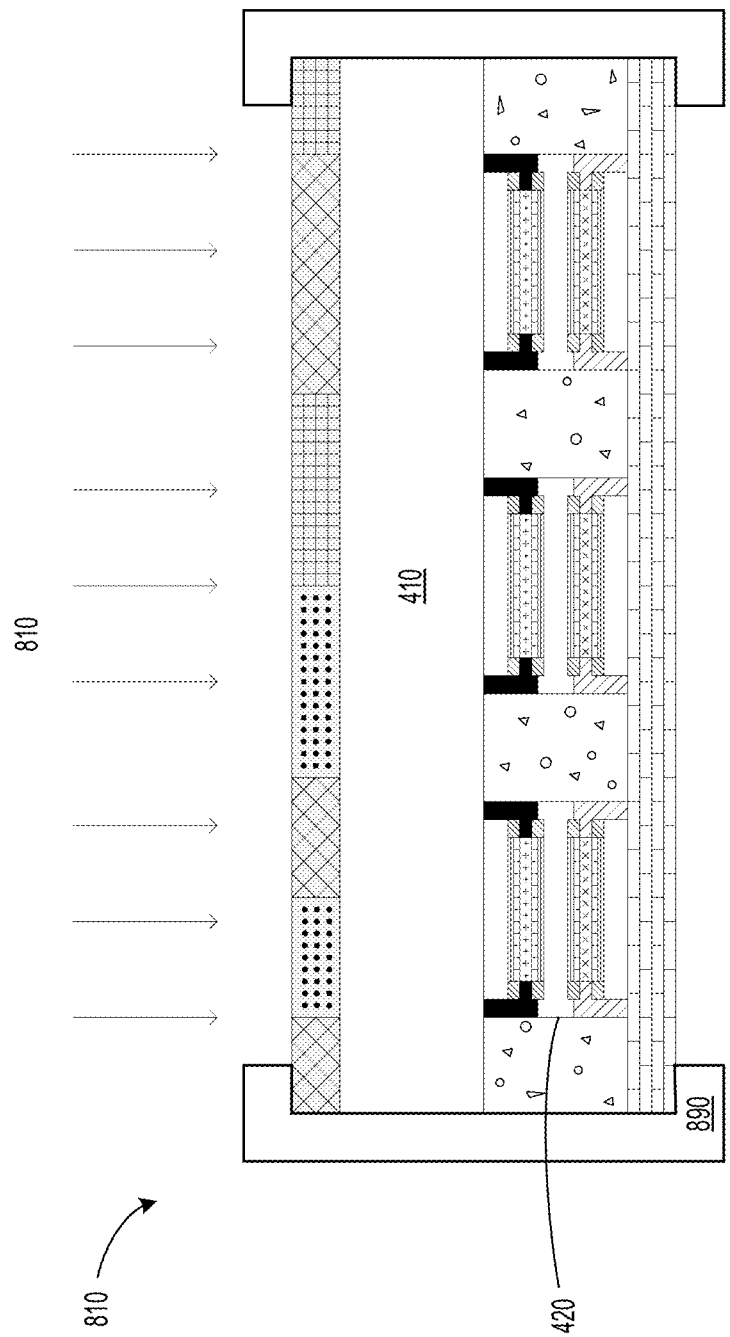
FIG. 8 shows a second exemplary process flow used to optimize wafer shape of a semiconductor structure, in accordance with some embodiments of the present disclosure.

FIG. 8 shows Process Flow B, which is used to optimize wafer shape of a semiconductor structure 800, in accordance with some embodiments of the present disclosure. Process Flow B differs from Process Flow A in that in Process Flow B a wafer damper 890 is used to clamp the wafer and multiple laser beam pulses 810 are used to apply the pattern of heat 300 onto the stress-modification film 610 to modify the internal stress of the stress-modification film based on the sub-bow measurements of the bow measurement of the wafer.

Figure 9:
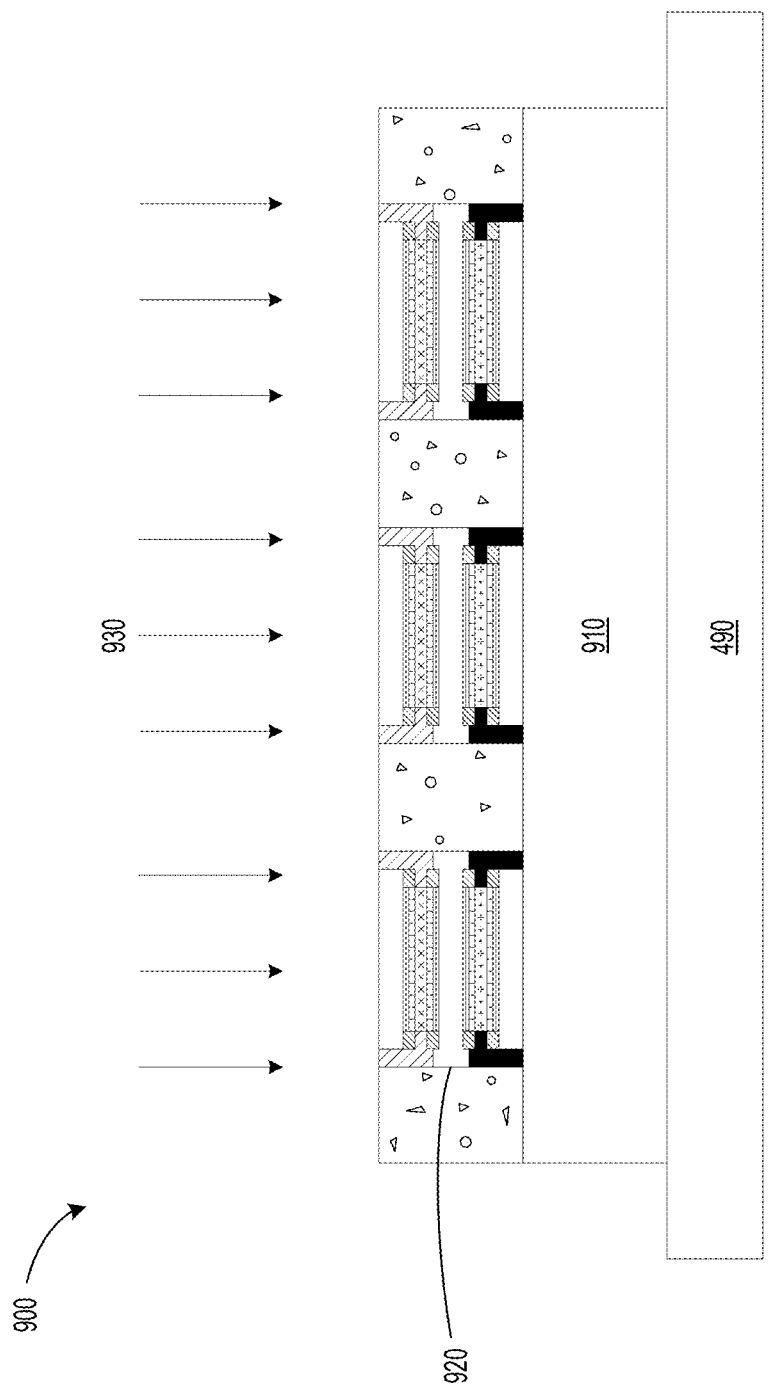
FIGS. 9 to 13 show a third exemplary process flow used to optimize wafer shape of a semiconductor structure, in accordance with some embodiments of the present disclosure.

FIGS. 9-13 show Process Flows C and D, which are used to optimize wafer shape of a semiconductor structure 900, in accordance with some embodiments of the present disclosure. As shown in FIG. 9, the semiconductor structure 900 is placed on the wafer chuck 490. The semiconductor structure 900 may include a substrate 910 and one or more semiconductor devices 920 fabricated on the substrate 910 through stack of 3D (GAA) nano sheets. The semiconductor devices 920 can include logic gates, memories and/or other components. For example, the semiconductor devices 920 can CFETs. A scanning laser technique 930 can be used, e.g., by the bow measurement device 210, to measure the z-direction height deviations across a surface of a wafer (including the substrate 910 and the semiconductor devices 920) and store the height deviations by (x, y) coordinates in order to identify the sub-bow measurements of the bow measurement of the wafer. In an embodiment, the sub-bow measurements have an arrangement corresponding to the heating units (and the pattern of heat 300) of the heat generator 230.

Figure 10:
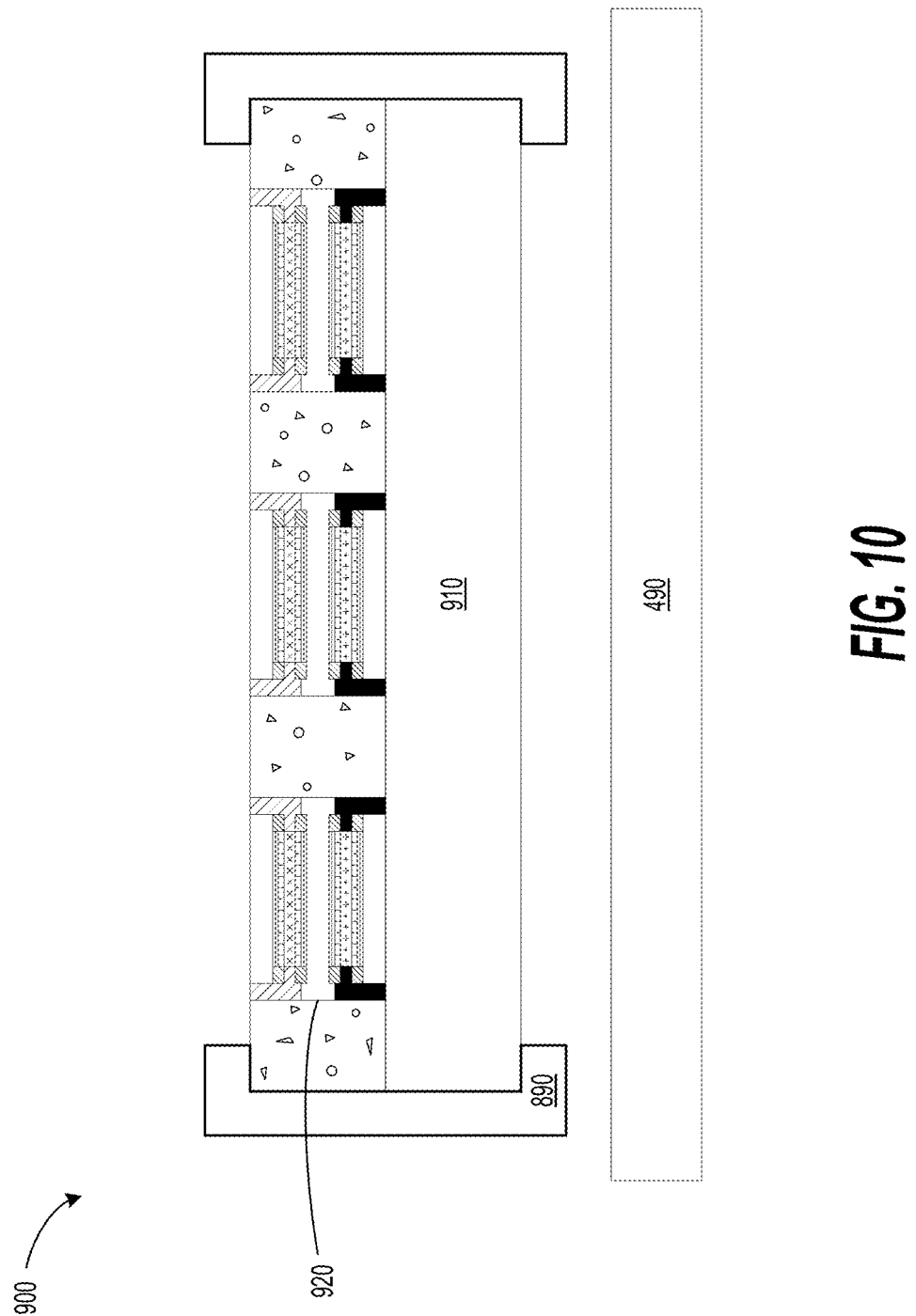

As shown in FIG. 10, the wafer is transferred to the wafer damper 890, e.g., a peripheral clamper, in a chamber, in which the stress-modification film formation device 220 is disposed to deposit and forms stress-modification films. In an embodiment, the substrate 910 side and/or the wafer chuck 490 may have laser zones such that during deposition the stress-modification films will be modified during the deposition conditions.

Figure 11:
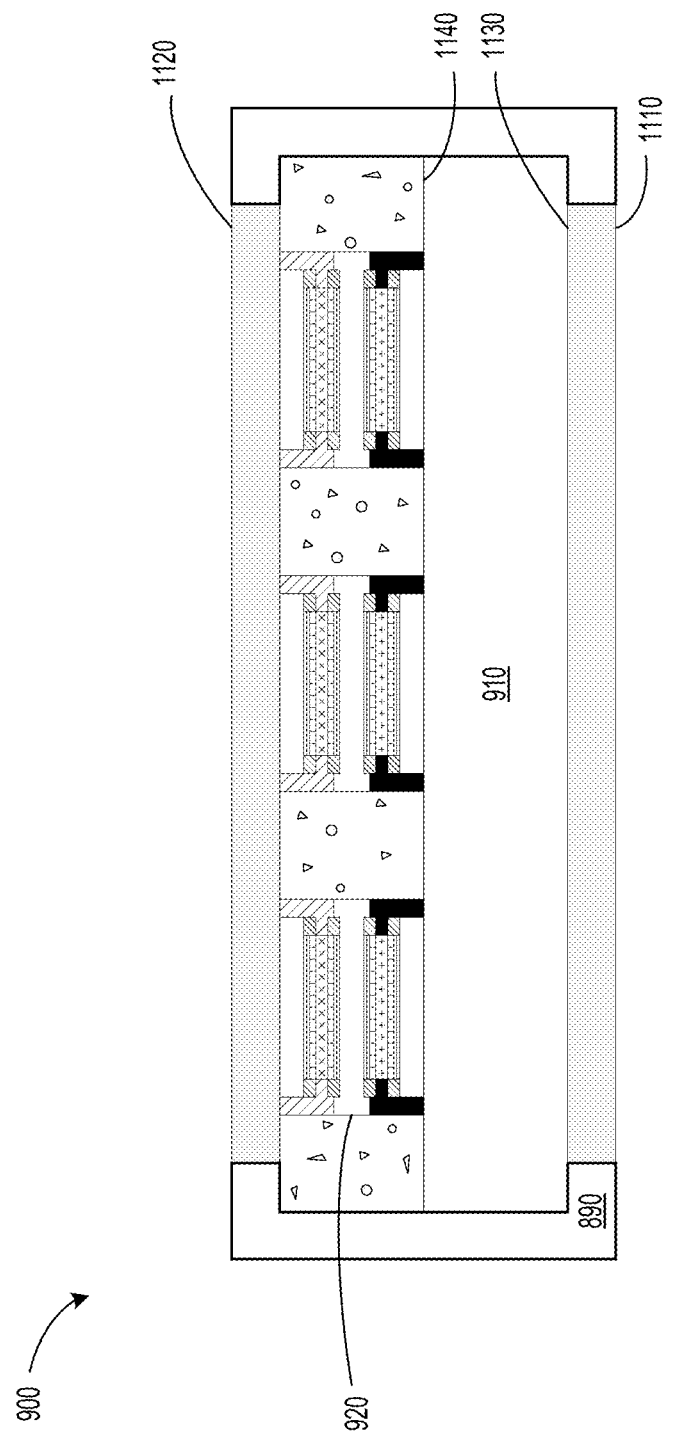

As shown in FIG. 11, stress-modification films are deposited on both surfaces of the wafer. For example, the stress-modification film formation device 220 deposit and form first and second stress-modification films 1110 and 1120 on backside and working surfaces 1130 and 1140 of the wafer, respectively.

Figure 12:
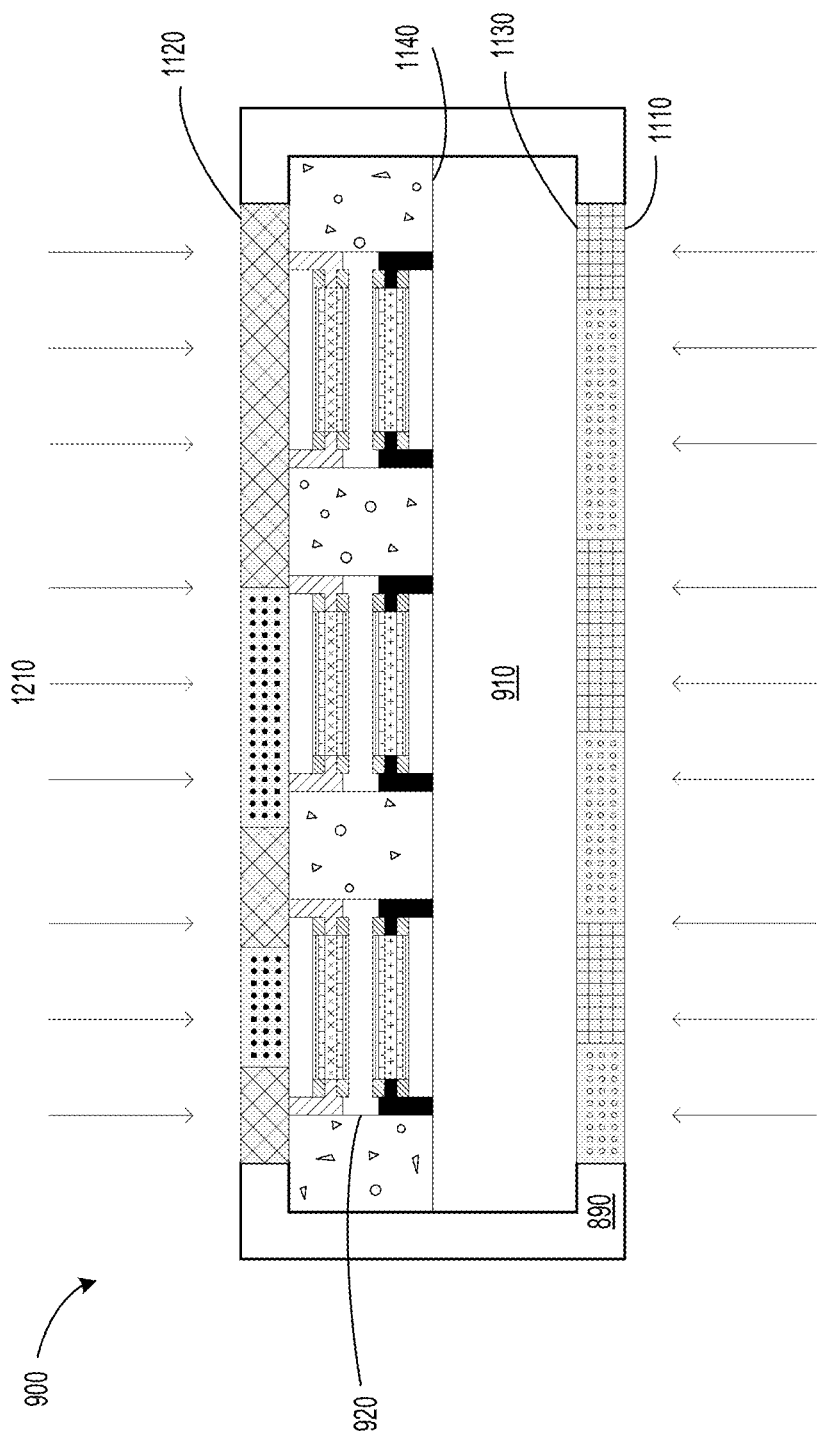

As shown in FIG. 12, multiple laser beam pulses or laser energy 1210 can be used to apply the pattern of heat 300 onto the first and second stress-modification films 1110 and 1120 to modify the internal stresses of the first and second stress-modification films 1110 and 1120 based on the sub-bow measurements of the bow measurement of the wafer. For example, the pattern of heat 300 generated by the multiple laser beam pulses or laser energy 1210 can include four temperature ranges of heat to produce four different stress values in one in-situ process step.

Figure 13:
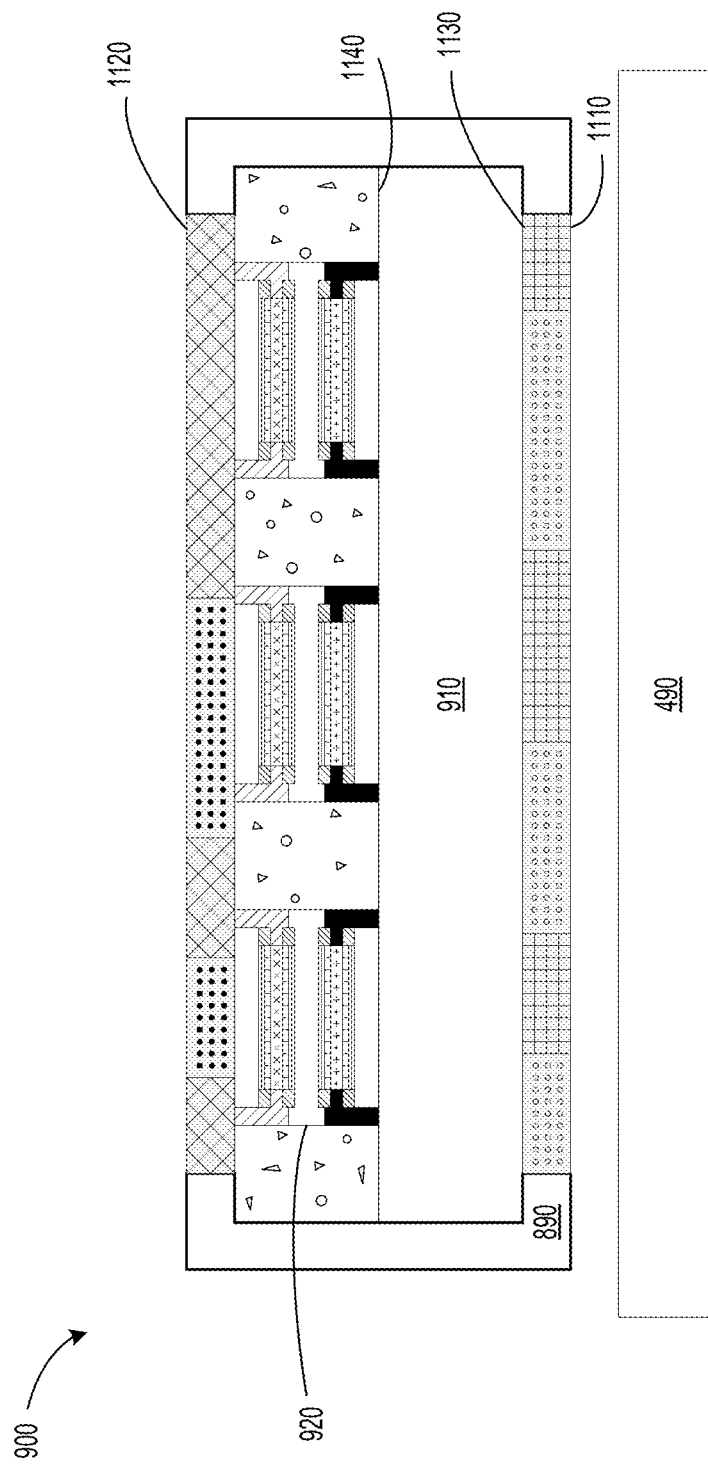

As shown in FIG. 13, the wafer with the first and second stress-modification films 1110 and 1120 with their internal stresses modified can be transferred back to the wafer chuck 490, and the semiconductor structure 900 can be completed through a photolithography module (not shown).

By way of a non-limiting example, in one process flow a wafer is loaded on a wafer chuck, which can be a multi-zone heating chuck, stress is measured, a robot handler transfers to clamped wafer holder, a first stress-modification film is deposited on working and backside surfaces of the wafer, expose both surfaces of the wafer to a pattern of heat based on a wafer signature, then a wafer handler can flip the wafer so that the working surface is up, and then photolithographic can be executed on the working surface.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method, comprising:
receiving a wafer having a working surface for one or more devices to be fabricated thereon, and a backside surface opposite to the working surface;
measuring the wafer to identify bow measurement of the wafer;
forming a first stress-modification film on the working surface of the wafer, the first stress-modification film reactive to heat such that applied heat modifies an internal stress of the first stress-modification film;
forming a second stress-modification film on the backside surface of the wafer, the second stress-modification film reactive to heat such that applied heat modifies an internal stress of the second stress-modification film;
applying a first pattern of heat onto the first stress-modification film to modify the internal stress of the first stress-modification film; and
applying a second pattern of heat onto the second stress-modification film to modify the internal stress of the second stress-modification film,
wherein the first and second patterns of heat correspond to the bow measurement of the wafer.

2. The method of claim 1, wherein at least one of the first and second patterns of heat is applied by a laser.

3. The method of claim 1, wherein the bow measurement includes a plurality of first sub-bow measurements, and the first pattern of heat is applied by a plurality of heating units that correspond to the first sub-bow measurements.

4. The method of claim 3, wherein the heating units are installed on a wafer chuck.

5. The method of claim 1, wherein forming a first stress-modification film is performed prior to measuring the wafer to identify bow measurement of the wafer.

6. The method of claim 5, wherein forming a second stress-modification film is performed prior to measuring the wafer to identify bow measurement of the wafer.

7. The method of claim 1, wherein forming a first stress-modification film is performed subsequent to measuring the wafer to identify bow measurement of the wafer.

8. A system, comprising:
a bow measurement device configured to measure a wafer to identify bow measurement of the wafer, the wafer having a working surface for one or more devices to be fabricated thereon, and a backside surface opposite to the working surface;
a stress-modification film formation device configured to form first and second stress-modification films, the first and second stress-modification films reactive to heat such that applied heat modifies internal stresses of the first and second stress-modification films;
a heat generator configured to generate a pattern of heat; and
a controller coupled to the bow measurement device, the stress-modification film formation device and the heat generator, the controller configured to control the bow measurement device to measure the wafer to identify the bow measurement of the wafer, control the stress-modification film formation device to form the first and second stress-modification films on the backside surface and working surface of the wafer, respectively, and control the heat generator to generate and apply the pattern of heat onto the first stress-modification film and/or the first and second stress-modification films, the pattern of heat corresponding to the bow measurement.

9. The system of claim 8, wherein the heat generator includes a laser.

10. The system of claim 8, wherein the bow measurement includes a plurality of sub-bow measurements, and the heat generator includes a plurality of heating units that correspond to the sub-bow measurements.

11. The system of claim 10, further comprising a wafer chuck, wherein the heating units are installed on the wafer chuck.

* * * * *